United States Patent [19]

Kirsch et al.

[11] Patent Number: 5,896,344
[45] Date of Patent: Apr. 20, 1999

[54] LOCAL WORD LINE DECODER FOR MEMORY WITH 2 1/2 MOS DEVICES

[75] Inventors: Howard C. Kirsch, Austin, Tex.; Yen-Tai Lin, Hsinchu, Taiwan

[73] Assignee: Vanguard International Semiconductor Corporation, Hsin-Chu, Taiwan

[21] Appl. No.: 08/944,771

[22] Filed: Oct. 6, 1997

[51] Int. Cl.[6] .................. G11C 8/00; G11C 7/00
[52] U.S. Cl. .................. 365/230.06; 365/189.05; 365/230.08
[58] Field of Search .................. 365/230.06, 200, 365/230.08, 189.05

[56] References Cited

U.S. PATENT DOCUMENTS 5,446,698  8/1995  McClure .................. 365/230.03
5,587,960  12/1996  Ferris .................. 365/230.03
5,608,678  3/1997  Lysinger .................. 365/200
5,612,918  3/1997  McClure .................. 365/200
5,648,933  7/1997  Slemmer .................. 365/200

*Primary Examiner*—David Nelms
*Assistant Examiner*—Trong Phan
*Attorney, Agent, or Firm*—George O. Saile; Stephen B Ackerman

[57] ABSTRACT

A method, a circuit, and a structure are disclosed by which the semiconductor area is reduced that a local word line decoder for a memory array requires. This reduction in area size has been achieved by eliminating one transistor of a three transistor local wordline decoder and introducing a fifth transistor which is shared by two local wordline decoders. The area occupied by the two eliminated transistors is no longer needed because the fifth transistor can be fitted between two existing transistors without an increase in area.

15 Claims, 3 Drawing Sheets

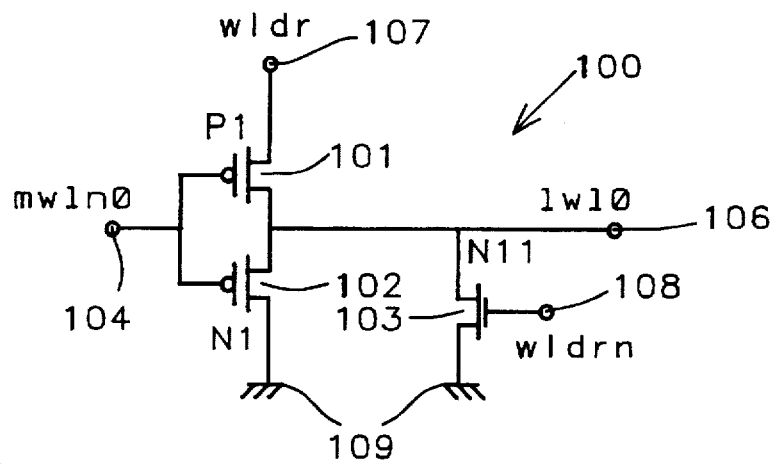
FIG. 1a – Prior Art
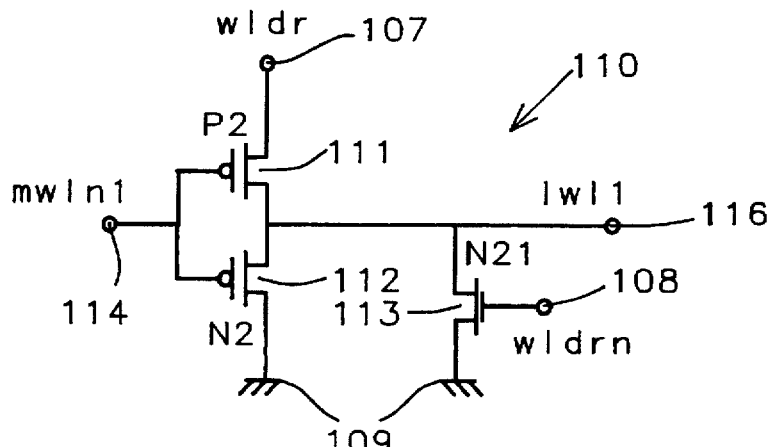
FIG. 1b – Prior Art
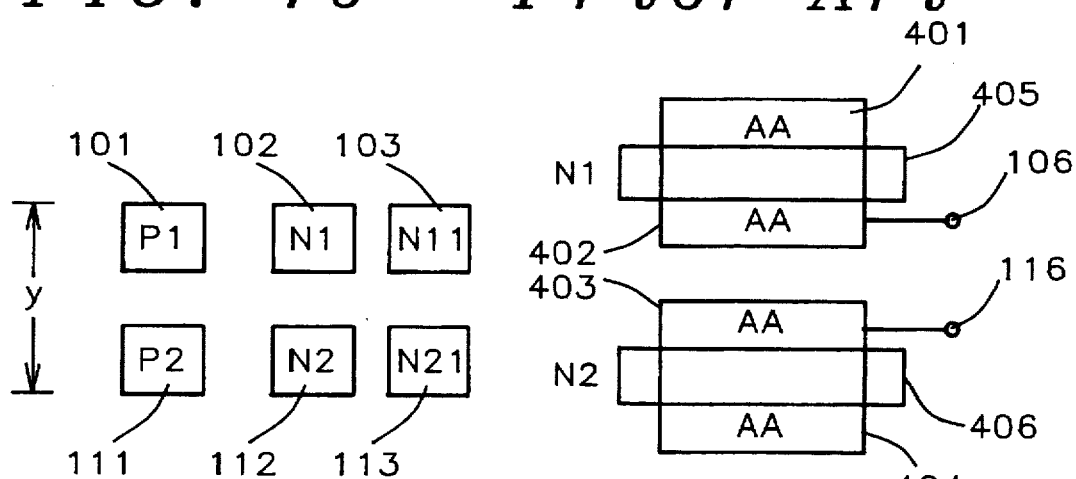
FIG. 2 – Prior Art
FIG. 3 – Prior Art

LOCAL WORD LINE DECODER FOR MEMORY WITH 2 1/2 MOS DEVICES

RELATED PATENT APPLICATION

V1S85-130, LOCAL WORD LINE DECODER FOR MEMORY WITH 2 MOS DEVICES, filing date Oct. 6,1997, Ser. No. 08/944,571, assigned to a common assignee.

BACKGROUND OF THE INVENTION

1. Field of the Invention

The invention relates to the field of semiconductor memory arrays, and in particular to reducing the semiconductor area of a wordline decoder.

2. Description of the Related Art

Two classes of local wordline decoders each utilizing three transistors are known in the related art. The circuits for these local wordline decoders are shown in FIGS. 1a and 1b. A circuit 100 for decoding a line 0 and an identical circuit 110 for decoding a line 1 are shown. P-channel transistor 101 (P1) and n-channel transistor 102 (N1) are connected in series between wordline driver input 107 and a reference potential 109. Input 104 (mwln0) connects to the gate of transistor 101 and 102. Output 106 (lwl0) is connected to the junction of transistors 101 and 102. Drain and source of n-channel transistor 103 (N11) are connected between output 106 and reference potential 109. The gate of transistor 103 is connected to input 108 (wldrn), which is the inverse of input 107.

Referring now to FIG. 1b, circuit 110 is explained next. P-channel transistor 111 (P2) and n-channel transistor 112 (N2) are connected in series between wordline driver input 107 and a reference potential 109. Input 114 (mwln1) connects to the gate of transistor 111 and 112. Output 116 (lwl1) is connected to the junction of transistors 111 and 112. Drain and source of n-channel transistor 113 (N21) are connected between output 116 and reference potential 109. The gate of transistor 113 is connected to input 108 (wldrn), which is the inverse of input 107.

Referring now to FIG. 2, we show a physical layout for the circuit of FIGS. 1a/1b. Transistors 101 (P1), 102 (N1), 103 (N11), 111 (P2), 112 (N2), and 113 (N21) are shown in an orthogonal arrangement of three columns and two rows. Dimension y is determined by the memory cell pitch. Referring now to FIG. 3, we show a more detailed layout of transistors N1, and N2. 401 and 402 are the active areas (AA) or n-type regions (source and drain) of transistor N1. Region 405 is the metal oxide gate of N1. 403 and 404 are the AA or n-type regions (source and drain) of transistor N2. Region 406 is the metal oxide gate of N2. N-type regions 402 and 403 connect to outputs 106 (lwl0) and 116 (lwl1) respectively.

U.S. Pat. No. 5,446,698 (McClure) discloses a redundant global wordline for local wordlines, however, the details of the local wordline decoder are not discussed. U.S. Pat. No. 5,587,960 (Ferris) describes a semiconductor memory with sub-wordlines but does not describe the details of the sub-wordline decoder.

SUMMARY OF THE INVENTION

It is an object of the present invention to provide a method, a circuit, and a structure by which to reduce the semiconductor area that a local word line decoder for a memory array requires.

It is another object of the present invention to reduce the chip size required for a memory array.

A further object of the present invention is to improve cell utilization.

These objects have been achieved by eliminating one transistor of a three transistor local wordline decoder and introducing a fifth transistor which is shared by two local wordline decoders. The area occupied by the two eliminated transistors is no longer needed because the fifth transistor can be fitted between two existing transistors without an increase in area.

BRIEF DESCRIPTION OF THE DRAWINGS

FIGS. 1a and 1b are a circuit diagram of one embodiment of a prior art wordline decoder.

FIG. 2 is a physical layout of the prior art wordline decoder of FIG. 1.

FIG. 3 is a detail view of a portion of FIG. 2.

DESCRIPTION OF THE PREFERRED EMBODIMENT

Figure 4:
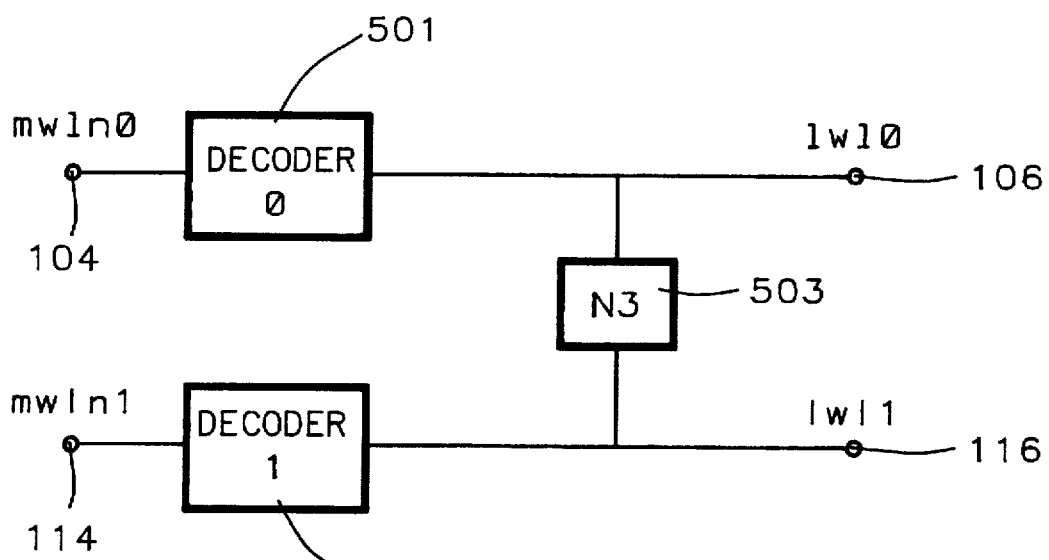
FIG. 4 is a high level block diagram of the present invention.

Referring now to the block diagram of FIG. 4, we show a method depicting the present invention of sharing a n-channel metal oxide semiconductor (NMOS) device between a first and a second local word line decoder in a semiconductor memory. Block 501 provides a first local wordline decoder with a first local wordline lwl0 as output. Block 502 provides a second local wordline decoder with a second local wordline lwl1 as output. Next, Block 503 provides a NMOS device which connects it between the first local wordline lwl0 and the second local wordline lwl1. Block 503 is, thus, shared between the first local wordline decoder and the second local wordline decoder and participates in the decoding of the first and second local wordline.

Figure 5:
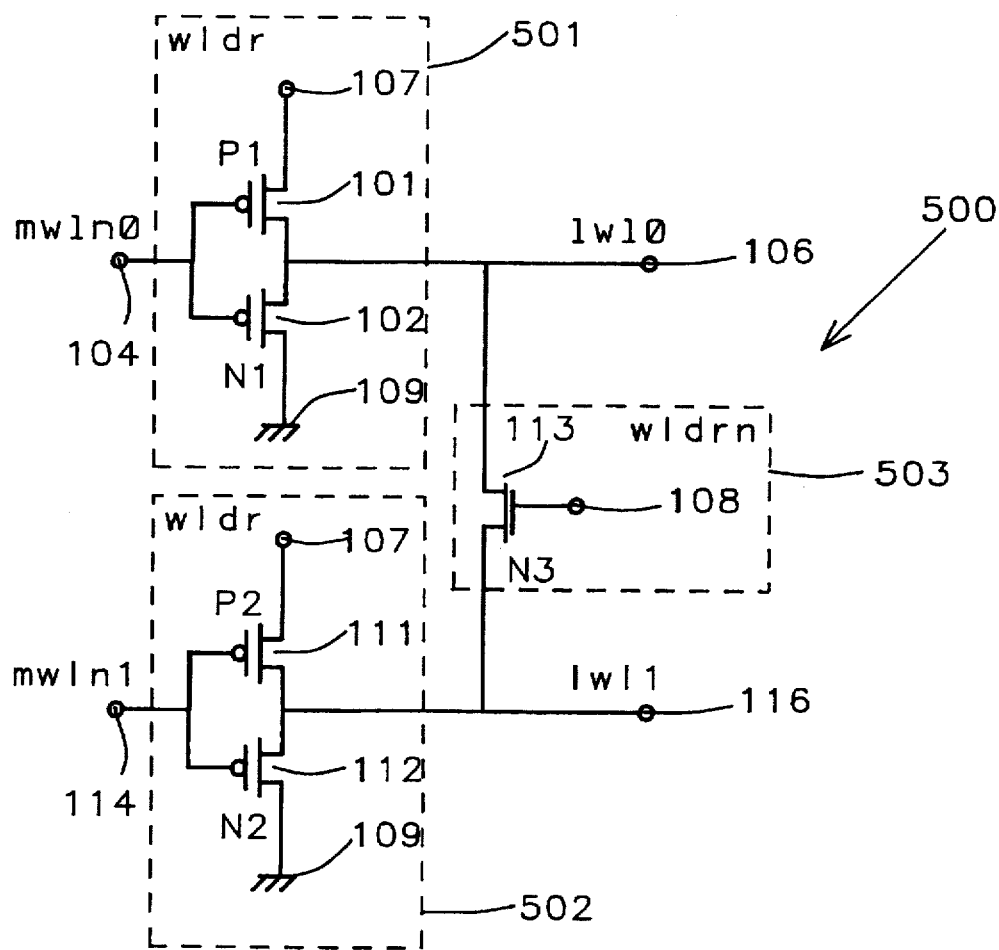
FIG. 5 is a circuit diagram showing a preferred embodiment of the present invention.

Referring now to FIG. 5 we show a circuit diagram depicting the preferred embodiment of the present invention. Decoder 500 comprises two local word line decoders and device 503. The first local wordline decoder 501 with a main word line input 104 (mwln0), p-channel transistor 101 (P1), n-channel transistor 102 (N1), and a first local wordline output 106 (lwl0) to decode the first main word line. The second local wordline decoder 502 with a main word line input 114 (mwln1), transistors 111 (P2) and 112 (N2) and a second local wordline output 116 (lwl1) to decode the second main word line. Device 503, a n-channel transistor connects between outputs lwl0 and lwl1 and shares in the decoding of both outputs. P-channel transistor 101 (P1) and n-channel transistor 102 (N1) are connected in series between wordline driver 107 (wldr) and a reference potential 109. P-channel transistor 111 (P2) and n-channel transistor 112 (N2) are connected likewise. The gates of transistors 101 and 102 connect to input 104, while the gates of transistors 111 and 112 connect to input 114. Output 106 connects to the junction of transistors 101 and 102, and output 116 connects to the junction of transistors 111 and 112. N-channel transistor 108 (N3) source and drain connect between lwl0 and lwl1, the gate of 108 is connected to the inverse word line driver 108 (wldrn).

Figure 6:
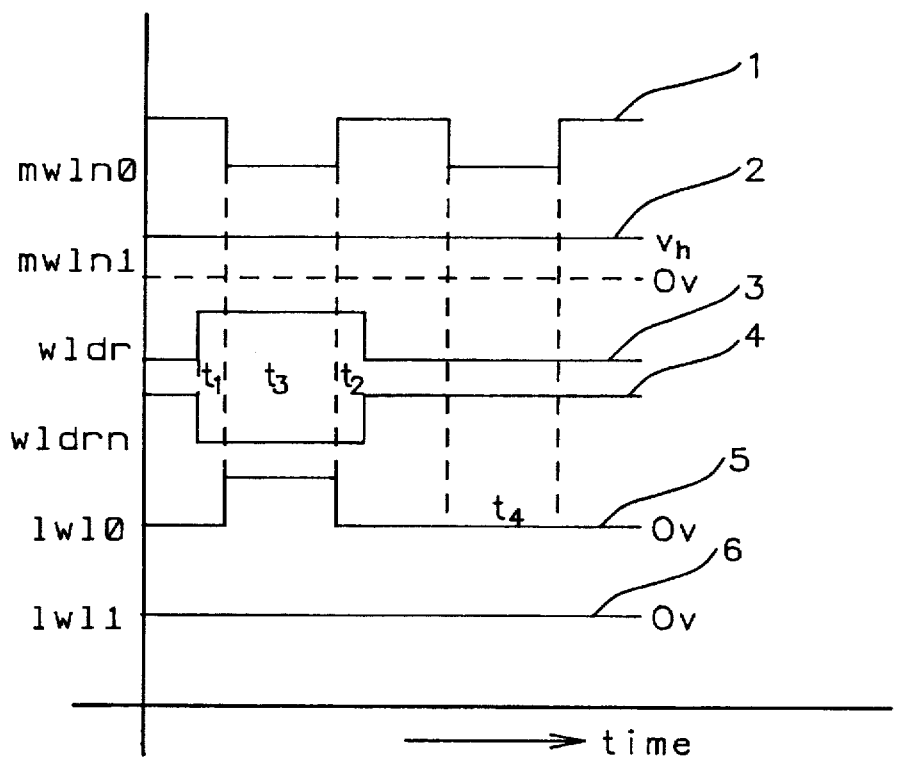
FIG. 6 is a view of the input and output signals of the circuit as shown in FIG. 5.

Referring now to FIG. 6 we show the input and output signals of the circuit of FIG. 5. Curves 1 and 2 are inputs 104 (mwln0) and 114 (mwln1) respectively, where, as an illustrative example, mwln1 is at constant potential $v_r$. Curves 3 and 4 are the wordline driver inputs wldr 107 and wldrn 108 respectively. Curve 5 depicts output 106 (lwl0) at a positive potential for one cycle as a result of the decoding circuit of FIG. 5. Curve 6 shows, in this example, output 116 (lwl1) at a constant 0 volt potential since local word line decoder 502 was not selected.

Figures 7, 8:
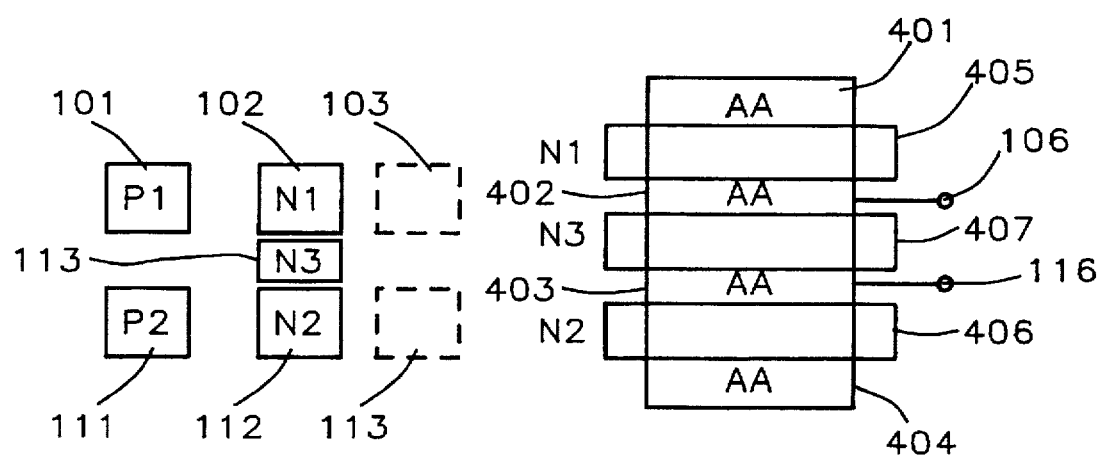
FIG. 7 is a physical layout of the wordline decoder circuit of FIG. 5.
FIG. 8 is a detail view of a portion of FIG. 7.

Referring now to FIG. 7, we show for the circuit of FIG. 5 the transistor placement on a silicon semiconductor wafer. Transistors 101 (P1), 102 (N1), 111 (P2), and 112 (N2) are shown in an orthogonal arrangement where P1 and P2 are in one column and N1 and N2 are in another but adjacent column and where transistors P1 and N1 are in one row and transistors P2 and N2 are in another but adjacent row. Sandwiched between N1 and N2 is n-channel transistor N3 (113). Note that a third column formerly occupied by transistors 103 (N11) and 113 (N21) has been eliminated by this present invention with a considerable savings in space.

Referring now to FIG. 8, we show a more detailed layout of transistors N1, N2, and N3. 401 and 402 are the active area (AA) or n-type regions (source and drain) of transistor N1. Region 405 is the metal oxide gate of N1, which attaches to input mwln0. 403 and 404 are the AA or n-type regions (source and drain) of transistor N2. Region 406 is the metal oxide gate of N2, which attaches to input mwln1. Transistor N3 (113) is now fitted between the AA or n-type regions 402 and 403 by utilizing regions 402 and 403 as the source and drain of transistor N3. The separation between 402 and 403 is no longer needed because of inserting n-channel transistor N3 and thus relaxes the n-type separation rule for process and improves the yield. Metal oxide gate 407 is placed between regions 402 and 403 and becomes the gate of transistor N3. Metal oxide gate 407 attaches to input wldrn. N-type regions 402 and 403 connect to outputs lwl0 and lwl1 respectively. Transistor N3 requires, therefore, no extra space with the result that the layout size will nearly be the same as that just using two MOS devices (P1 and N1) per local word line decoder.

As is evident from FIG.'s 7 and 8, the metal oxide gates separating the n-type regions are parallel to each other, similarly the n-type regions are parallel to each other and to the metal oxide gates. Transistors P1 and P2 are constructed in a fashion similar to the n-channel transistors N1 and N2, having p-type regions, corresponding to source and drain and having a metal oxide gate which separates the p-type regions. P-channel transistors P1 and P2 are in close proximity to the n-channel transistors N1 and N2.

The advantages of this present invention are a reduced size local wordline decoder which results in a reduction of the chip size and an improvement of cell utilization by relaxing the n-type separation rule for process; it also improves the yield. The improvement is significant since, as the device fabrication process moves to 0.35 μm and 0.25 μm, cell size is shrinking faster than wordline pitch calling for local word line decoders for each main wordline. With the use of local wordlines the decoder size in turn needs to be reduced since many decoder circuits are required.

While the invention has been particularly shown and described with reference to the preferred embodiments thereof, it will be understood by those skilled in the art that various changes in form and details may be made without departing from the spirit and scope of the invention.

What is claimed is:

1. A method for sharing a n-channel metal oxide semiconductor device between a first and a second local word line decoder in a semiconductor memory, comprising:

providing a first local wordline decoder with a first local wordline;

providing a second local wordline decoder with a second local wordline;

providing said n-channel metal oxide semiconductor device;

connecting said n-channel metal oxide semiconductor device between said first local wordline and said second local wordline; and sharing said n-channel metal oxide semiconductor device between said first local wordline decoder and said second local wordline decoder.

2. The method of claim 1, wherein said n-channel metal oxide semiconductor device participates in the decoding of said first local wordline.

3. The method of claim 1, wherein said n-channel metal oxide semiconductor device participates in the decoding of said second local wordline.

4. A wordline decoder circuit for a semiconductor memory sharing a n-channel metal oxide semiconductor device between a first and a second local word line decoder, comprising:

said first local wordline decoder activating a first local wordline;

said second local wordline decoder activating a second local wordline; and said n-channel metal oxide semiconductor device connected between said first local wordline and said second local wordline.

5. A wordline decoder circuit for a semiconductor memory, comprising:

a first local wordline decoder with an input mwln0, an input wldr, a connection to a reference potential, and an output lwl0, said first local wordline decoder activating said output lwl0;

a second local wordline decoder with an input mwln1, said input wldr, a connection to said reference potential, and an output lwl1, said second local wordline decoder activating said output lwl1; and a n-channel metal oxide semiconductor device connected between said outputs lwl0 and lwl1, and having an input wldrn.

6. The circuit of claim 5, wherein said first local wordline decoder comprises:

a first p-channel transistor having a source-drain path and a gate, said source-drain of said first p-channel transistor connected between said input wldr and said output lwl0, said gate of said first p-channel transistor connected to said input mwln0; and a first n-channel transistor having a drain-source path and a gate, said drain-source of said first n-channel transistor connected between said output lwl0 and said reference potential, said gate of said first n-channel transistor connected to said input mwln0.

7. The circuit of claim 5, wherein said second local wordline decoder comprises:

a second p-channel transistor having a source-drain path and a gate, said source-drain of said first p-channel transistor connected between said input wldr and said output lwl1, said gate of said second p-channel transistor connected to said input mwln1; and a second n-channel transistor having a drain-source path and a gate, said drain-source of said second n-channel transistor connected between said output lwl1 and said reference potential, said gate of said second n-channel transistor connected to said input mwln1.

8. The circuit of claim 5, wherein said n-channel metal oxide semiconductor device comprises:

a third n-channel transistor having a drain-source path and a gate, said drain-source of said third n-channel transistor connected between said output lwl0 and said output lwl1, said gate of said third n-channel transistor connected to said input wldrn.

9. A structure for a wordline decoder circuit sharing a n-channel metal oxide semiconductor device between a first and a second local word line decoder, comprising:

a first n-channel transistor having a first and a second n-type region and a first metal oxide gate, where said first and said second n-type regions are embedded in an active area region;

a second n-channel transistor having a third and a fourth n-type region and a second metal oxide gate, where said third and said fourth n-type regions are embedded in said active area region; and a third n-channel transistor having said second and third n-type region and a third metal oxide gate, where said second and said third n-type regions are embedded in said active area region.

10. The structure of claim 9, wherein said first n-type region is separated from said second n-type region by said first metal oxide gate.

11. The structure of claim 9, wherein said third n-type region is separated from said fourth n-type region by said second metal oxide gate.

12. The structure of claim 9, wherein said second n-type region is separated from said third n-type region by said third metal oxide gate.

13. The structure of claim 9, wherein said metal oxide gates are parallel to each other in said n-type regions.

14. The structure of claim 9, wherein said structure further comprises:

a first p-channel transistor having a first and a second p-type region and a first metal oxide gate, where said first p-channel transistor is in close proximity to said first n-channel transistor; and a second p-channel transistor having a third and a fourth p-type region and a second metal oxide gate, where said second p-channel transistor is in close proximity to said second n-channel transistor.

15. The structure of claim 14, wherein said metal oxide gates are parallel to each other in said p-type regions.

* * * * *